United States Patent [19]

Twieg

[11] Patent Number: 4,982,161
[45] Date of Patent: Jan. 1, 1991

[54] MULTIMODE MAGNETIC RESONANCE FAST IMAGING METHOD

[75] Inventor: Donald B. Twieg, Novato, Calif.

[73] Assignee: North American Philips Corporation, New York, N.Y.

[21] Appl. No.: 398,112

[22] Filed: Aug. 24, 1989

[51] Int. Cl.$^5$ ............................................ G01R 33/20
[52] U.S. Cl. ................................................ 324/309
[58] Field of Search ............... 324/300, 307, 309, 310, 324/311, 312, 313, 314, 318, 322; 128/653 A, 653 R

[56] References Cited

U.S. PATENT DOCUMENTS

| | | | |
|---|---|---|---|
| 4,564,017 | 1/1986 | Glover | 128/653 R |
| 4,567,893 | 2/1986 | Charles | 128/653 A |
| 4,678,996 | 7/1987 | Haacke | 324/309 |
| 4,780,675 | 10/1988 | DeMeester | 324/312 |
| 4,851,779 | 7/1989 | DeMeester | 324/312 |
| 4,857,846 | 8/1989 | Carlson | 324/309 |
| 4,876,508 | 10/1989 | Taylor | 324/309 |
| 4,912,413 | 3/1990 | DeMeester | 324/312 |
| 4,937,526 | 6/1990 | Ehman et al. | 324/309 |

OTHER PUBLICATIONS

W. Sattin, "Syncopated Periodic Excitation (SPEX): Fast Imaging With Reduced Susceptibility Artifacts", SMRI 1988: Sixth Annual Meeting Program & Abstracts, No. 203.

P. van der Meulen et al., "Fast Field Echo Imaging: An Overview & Contrast Calculations", Magnetic Resonance Imaging, vol. 6, pp. 355–368, 1988.

S. Patz et al., "Missing Pulse Steady-State Free Precession", Magnetic Resonance In Medicine, vol. 10, pp. 194–209, 1989.

Primary Examiner—Michael J. Tokar
Attorney, Agent, or Firm—Jack D. Slobod

[57] ABSTRACT

A magnetic resonance imaging method of fast contemporaneous aquisition of differently weighted plural images using sequences having cycles composed of a plurality of different sub-cycles or modes which interact to produce a steady state free precession spin ensemble. Each sub-cycle has an rf excitation pulse and gradient magnetic field variations in orthogonal directions. For each sub-cycle, the excitation pulse flip angle, the sub-cycle duration, and the vector gradient integral over the sub-cycle is the same in each cycle. The sub-cycles differ from each other in at least one of pulse angle, duration and gradient integral. The gradient waveforms are chosen so that the steady state free precession spin ensemble, when represented in k-space, has spaced apart differently weighted image transform lobes, a plurality of which are scanned by k-space excursions in each sub-cycle exciting gradient echo signals which may be separately collected for each image transform lobe of interest.

17 Claims, 4 Drawing Sheets

MULTIMODE MAGNETIC RESONANCE FAST IMAGING METHOD

BACKGROUND OF THE INVENTION

1. Field of the Invention

The present invention relates generally to methods for enabling relatively rapid image acquisition through the collection of magnetic resonance signals using a scanning sequence having cycles or sub-cycles with a duration typically of the same order of magnitude as the longitudinal and/or transverse relaxation time constants of a material of interest. The present invention also relates to scanning sequences composed of two or more sub cycles or modes.

2. Description of the Prior Art

The desire to increase productivity of medical diagnostic magnetic resonance imaging (MRI) equipment has led to the development of numerous rapid scanning techniques for reducing the duration of MRI examinations. Typically, each cycle of a scanning sequence has a duration $T_R$ on the order of the longitudinal relaxation time constant $T_1$ of the material of interest, each cycle having an RF excitation pulse characterized by an angle $\alpha$ (the magnetic flip angle caused by the pulse) which is substantially optimized for signal to noise ratio as a known function of $T_R$ and $T_1$. Because the precessing nuclear resonance spins excited by each RF excitation pulse do not relax to insignificance before the next RF excitation pulse, there arises an interaction between successive cycles such that a steady state free precession spin ensemble is formed from which gradient echoes are excited during the sequences. Typical fast imaging methods are discussed in P. van der Meulen, et al, "FAST FIELD IMAGING: An Overview and Contrast Calculations", Magnetic Resonance Imaging, Vol. 6, pp. 335-368, 1988. While typical fast imaging techniques have utilized a constant period $T_R$ between excitation pulses, a different class of sequences, with no single interpulse period, designated SYNCOPATED PERIODIC EXCITATION (SPEX) has been considered to form a steady state spin ensemble. W. Sattin, "SYNCOPATED PERIODIC EXCITATION (Spex): Fast Imaging With Reduced susceptibility Artifacts" SMRI 1988: SIXTH ANNUAL MEETING PROGRAM AND ABSTRACTS No. 203 and S. Patz et al, "MISSING PULSE STEADY STATE FREE PRECESSION", Magnetic Resonance in Medicine 10, pp. 194-209 (1989) have proposed sequences having two different interpulse periods of durations T and 2T.

It is known in conventional magnetic resonance imaging that the image formed from collected magnetic resonance signals represents a spatial distribution of nuclear magnetization spin densities. The spin density at each point in space may be a combination of contributions from physically different spin populations having different characteristics such as transverse and/or longitudinal relaxation. The areas of contrast in an image may therefore be varied by emphasizing or deemphasizing the contributions from the physically different populations. This emphasis or deemphasis is a weighting due to the various parameters of a sequence such as the time $T_E$ after an excitation pulse when an echo is excited. Other weightings are possible to attempt to emphasize such physical characteristics as the relative Larmor frequency of the population, the flow or diffusion of the population or the degree of coupling of the population to other excited spin systems. Furthermore, comparisons between differently weighted images provide the potential for further types of contrast emphasis or deemphasis.

The essentially identical techniques proposed by Lee and Cho, Magnetic Resonance in Medicine 8, 142-150 (1988) and by Redpath and Jones, Magnetic Resonance in Medicine 6, 224 (1988) contemporaneously generate two separate images from the free induction decay (FID) signal and a "contrast enhanced" echo signal in a conventional "single-mode" steady state free precession sequence. However, the range of Weights for this pair of images is relatively limited, generally not allowing sufficient flexibility to substantially isolate dependence on any particular distinct parameter.

SUMMARY OF THE INVENTION

It is an object of the present invention to provide a method of fast contemporaneous acquisition of images with widely adjustable weights and means for performing the method.

The foregoing and other objects are met by a magnetic resonance imaging method in which the sequences are chosen to produce magnetic resonance echo signals characterized by a steady state free precession function in k-space (spatial frequency space) having spaced apart image transform lobes from which the echoes are selectively excited.

The lobes represent shifted spatial Fourier transforms or spatial frequency distributions of images of different weights. Each sequence may be structured to excite plural echoes spaced apart in time from different selected transform lobes by appropriate scans in k-space. In fact, four separate lobes are conveniently scanned in the same cycle.

The steady state free precession spin ensemble is the result of a multiple mode sequence in which each sequence has at least two sub-cycles of respective durations $T_A$ and $T_B$, and with respective RF excitation pulse angles $\alpha_A$ and $\alpha_B$. The two sub cycles respectively have constant vector gradient integrals $K_A$ and $K_B$ over the sub cycles which integrals correspond to excursions in k-space during the two sub-cycles from $k=0$ to $k=K_A$ and $k=0$ to $k=K_B$, respectively. By multiple mode, it is meant that the two sub-cycles differ in at least one of their pulse angle, duration and gradient integral. The paths of these excursions are structured to include scans spaced apart in time directed through the transform lobes of interest, each scan corresponding to the excitation of a gradient echo by inducing a coherence in the transform lobe scanned.

Because the gradient echoes from plural different lobes are excited spaced apart in time during each cycle, the echoes from each lobe may be separately collected resulting in simultaneous acquisition of plural images of different weights. The multiple mode aspect of the sequence enables the flexibility to select the weighting type over a vast range and to in fact isolate dependence on particular parameters of interest.

BRIEF DESCRIPTION OF THE DRAWING

Other objects, features and advantages of the present invention will become apparent upon perusal of the following detailed description of the preferred embodiments when taken in conjunction with the appended drawing wherein.

DETAILED DESCRIPTION OF THE PREFERRED EMBODIMENTS

General background for the subject matter herein can be found in the book "PRACTICAL NMR IMAGING", M. A. Foster and J. M. S. Hutchinson—Editors, IRL Press Limited, 1987. The present invention is best understood by beginning with a discussion of the MR tomography apparatus.

Figure 1:
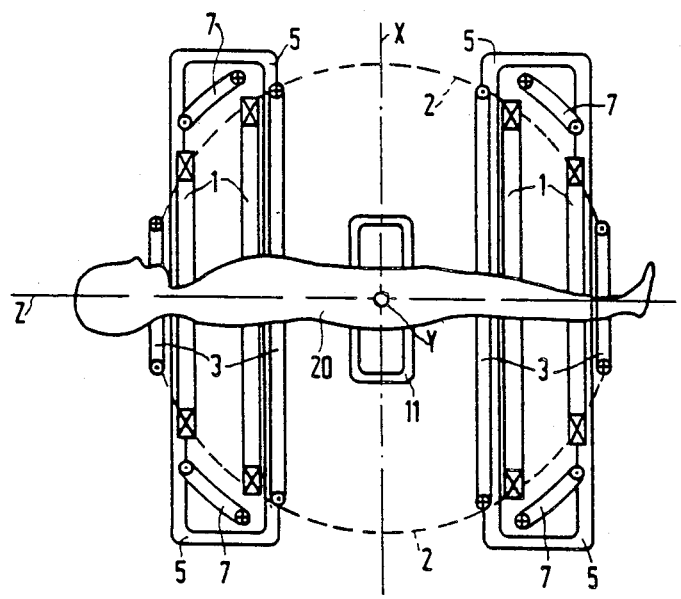
FIG. 1 shows a nuclear magnetic resonance tomography apparatus in which the invention can be used.

The MR tomography apparatus which is diagrammatically shown in FIG. 1 comprises a system for generating a steady, uniform magnetic field which consists of four coils 1. This field extends in the z-direction of a cartesian xyz coordinate system. The coils 1 are concentrically situated with respect to the z-axis and may be arranged on a spherical surface 2. The patient 20 to be examined is situated within these coils.

In order to generate a magnetic gradient field Gz which extends in the z-direction and which linearly varies in this direction, there are provided four coils 3 which are preferably arranged on the same spherical surface. There are also provided four coils 7 which generate a magnetic gradient field Gx which also extends in the z-direction but whose strength varies linearly in the x-direction which variation is described as a gradient extending in the x-direction. A magnetic gradient field Gy which extends in the z-direction and which has a gradient in the y-direction is generated by four coils 5 which may have the same construction as the coils 7 but which are arranged so as to be rotated through 90° with respect thereto. Only two of these four coils are shown in FIG. 1. Because each of the three coil systems 3, 5 and 7 for respectively generating the magnetic gradient fields Gz, Gy, and Gx is symmetrically arranged with respect to the spherical surface 2, the field strength in the center of the sphere, being at the same time the origin of the cartesian coordinate system, will be determined only by the steady, uniform magnetic field of the coil system 1.

There is also provided an RF coil 11 which is symmetrically arranged with respect to the plane z=0 of the coordinate system and which is constructed so that it generates an RF magnetic field which is substantially uniform and which extends in the x-direction, i.e. perpendicularly with respect to the direction of the steady, uniform magnetic field. The RF coil receives an RF modulated current from an RF generator during each RF pulse. Subsequent to each RF pulse, the RF coil 11 serves for receiving spin resonance signals generated in the examination zone. However, a separate RF receiving coil may also be used instead.

Figure 2:
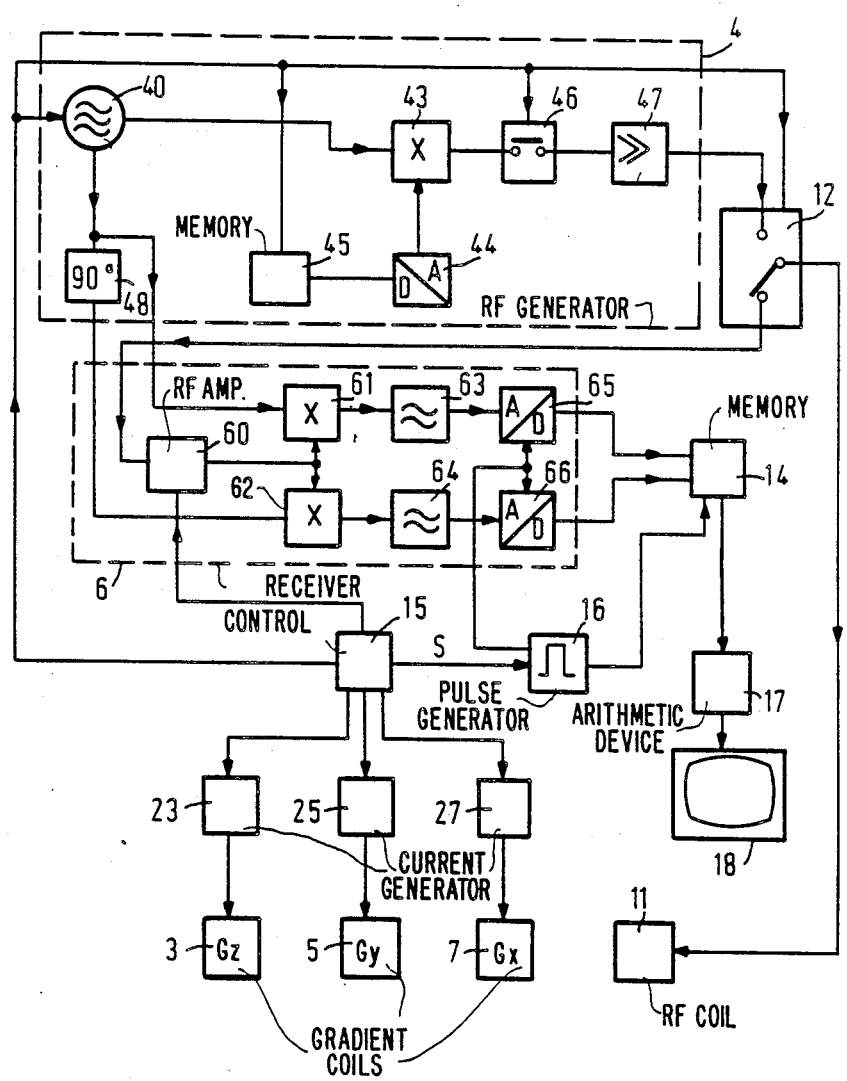
FIG. 2 shows a block diagram schematic of such an apparatus.

FIG. 2 shows a simplified diagram of the above MR tomography apparatus. Via a switching device 12, the RF coil 11 is connected on the one side to an RF generator 4 and on the other side to an RF receiver 6.

The RF generator 4 comprises an RF oscillator 4 whose frequency can be digitally controlled and which generates oscillations with a frequency which is equal to the Larmor frequency of the nuclei to be excited at the field strength generated by the coils 1. As is known, the Larmor frequency f can be calculated in accordance with the relation f=cB, where B is the magnetic flux density in the steady, uniform magnetic field and c is the gyromagnetic ratio; for example, for protons this ratio amounts to 42.56 MHz/T. The output of the oscillator 4 is connected to an input of a mixing stage 43. The mixing stage 43 receives a second input signal from a digital-to-analog converter 44 whose output is connected to a digital memory 45. A series of digital data words which represent a pulse envelope signal is read from the memory under the control of a control device 15.

The mixing stage 43 processes the input signals applied thereto so that the carrier oscillation modulated with the envelope signal appears on its output. The output RF pulse signal of the mixing stage 43 is applied, via a switch 46 which is controlled by the control device 15, to an RF power amplifier 47 whose output is connected to the switching device 12. The latter device is also controlled by the control device 15.

The receiver 6 comprises an RF amplifier 60 which is connected to the switching device and which receives the echo signal induced in the RF coil 11; the switching device must then be in the appropriate switching position. The amplifier 60 comprises a muting input which is controlled by the control device 15 and via which it can be blocked so that its gain is substantially zero. The output of the amplifier is connected to the first inputs of two multiplying mixing stages 61 and 62, each of which supplies an output signal which corresponds to the product of their input signals. The second inputs of the mixing stages 61 and 62 receive a signal having the frequency of the oscillator 40, there being a phase difference of 90° on the two inputs. This phase shift is created by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via low-pass filters 63 and 64 which suppress the frequency supplied by the oscillator 40 as well as all higher frequencies and which conduct lower frequency components, to respective analog-to-digital converters 65, 66. These converters convert the analog signals of the circuit 61 ... 64 forming a quadrature demodulator, into digital data words which are applied to a memory 14. The analog-to-digital converters 65 and 66 as well as the memory receive their clock pulses from a clock pulse generator 16 which can be blocked and released by the control device 15, via a control lead, so that the signal supplied by the RF coil 11 and transposed to the low frequency range can be converted into a series of digital data words for storage in the memory 14 only during a measurement interval which is defined by the control device 15.

The data words or sampling values stored in the memory 14 are applied to an arithmetic device which determines therefrom the spatial distribution of the nuclear magnetization in a slice of the examination zone in which outputs the distribution thus determined to a suitable display apparatus, for example a monitor 18. Current generators 23, 25 and 27 supply the three coil systems 3, 5 and 7 with currents having variations in time controlled by control unit 15.

In the present invention, RF excitation pulses and gradient waveform variations are applied in a sequence of cycles in which, for fast imaging purposes, the time between excitation pulses is in the same order of magnitude as the longitudinal and/or transverse relaxation time constants $T_1$, $T_2$ of the material of interest. Furthermore, each cycle is characterized by a plurality of sub-cycles, each having an excitation RF pulse and an ensuing interval during which the excited nuclear magnetization spins at each point somewhat relax while precessing at an instantaneous Larmor frequency proportionate to the instantaneous longitudinal magnetic field at the point as influenced by the instantaneous magnetic gradient fields, the various gradients Gx, Gy and Gz being describable as the orthogonal components of a vector gradient. The instantaneous time integral over the vector gradient during each sub-cycle represents an excursion in the spatial frequency space or Fourier transform space known as k-space. The present invention is characterized by a sequence composed of at least two different sub-cycles in each cycle, wherein the integral of the vector gradient over each sub-cycle is the same in each successive cycle. Thus, the excursion in k-space for the same sub-cycle in each successive cycle in the sequence may have the same end point.

In a dual mode sequence having a pair of sub-cycles with the respective different vector gradient integrals $K_A$ and $K_B$, the instantaneous magnetic resonance signal $S_B(t)$ during sub-cycle "B" due to the combined effect of the nuclear magnetization spins excited in that sub cycle and in the preceding sub cycle "A" is of the form:

$$S_B(t) = W_{B0}F(k(t)) + W_{B1}F(k(t) - K_A) + W_{B2}F(k(t) + K_A) + W_{B3}F(k(t) - K_B) + W_{B4}F(k(t) - (K_B - K_A)) + W_{B5}F(k(t) - (K_A K_B))$$

where k(t) is the instantaneous transverse vector gradient integral, and F(k) is the two dimensional Fourier transform of the image as a function thereof. $W_{B1}$ through $W_{B5}$ are scalar functions of $\alpha_A$, $\alpha_B$, $T_A$, $T_B$, $T_1$ and $T_2$, the latter two being respectively the longitudinal and transverse relaxation time constants of the material in the spin population.

It should thus be apparent that the foregoing expression corresponds to differently weighted image transform lobes centered at $k=0$, $K_A$, $-K_A$, $K_B$, $K_B-K_A$ and $K_B+K_A$. Since the expression for $S_A(t)$ is expected, on account of symmetry, to have transform lobes centered additionally about $-K_B$ and $K_A-K_B$, it should be appreciated that the steady state free precession spin ensemble is characterized by the usual main transform lobe centered at $k=0$ and a plurality of other spaced-apart image transform lobes centered about various other points in k-space including the following points: $\pm K_A$, $\pm K_B$, $K_A \pm K_B$, and, $K_A + K_B$. If the magnitudes of the vectors from $k=0$ to these other points are chosen to be much greater than the greatest spatial frequency present in the image transform, the transform lobes are sufficiently separated that they can be separately scanned in k-space.

Figure 3:
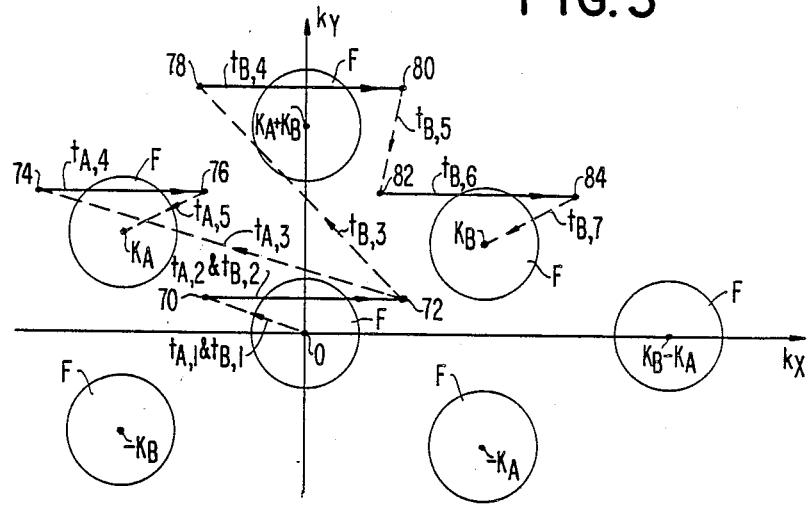
FIG. 3 is a diagram of k-space excursions due to a first illustrative sequence in accordance with the principles of the present invention.
Figure 4:
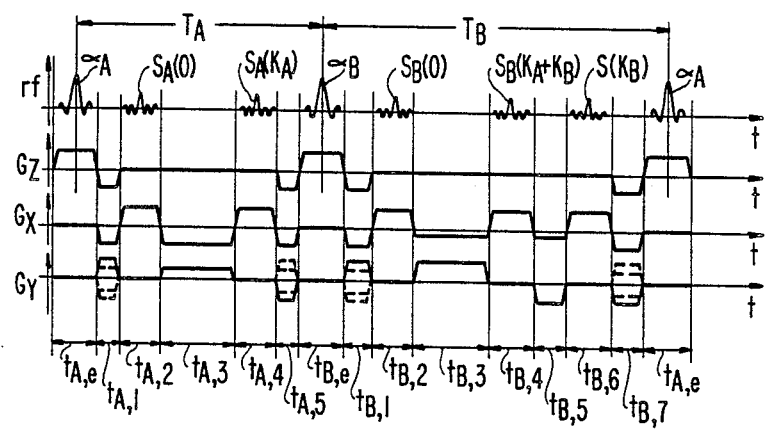
FIG. 4 is a time diagram of RF and gradient signals for the first illustrative sequence in accordance with the present invention producing the k-space excursions in FIG. 3.

FIG. 3 illustrates, in a portion of k-space, the various lobes "F" in the steady state free precession spin ensemble resulting from $K_A$ and $K_B$ selected to be in adjoining quadrants and to have equal magnitudes. In FIG. 3, two sets of excursions in k-space are shown respectively produced by two sub-cycles of variation of magnetic gradient and RF fields. The fundamental cycle of the sequence is illustrated in FIG. 4 containing the two sub-cycles. In the first sub-cycle of length $T_A$, there is an RF excitation pulse having a flip angle $\alpha_A$, generally less than 90° and being for example of truncated SINC shape, which RF excitation pulse is in the presence of a slice selection gradient Gz during the time $t_{Ae}$. Following said excitation pulse there is the first excursion in the k-space from $k=0$ to $k=K_A$ during the time interval $t_{A1}$ through $t_{A5}$. In the second sub-cycle of length $T_B$ greater than $T_A$, after a second RF excitation pulse of flip angle $\alpha_B$ (also generally less than 90°) which is coherent with the first RF pulse, in the presence of the slice selection gradient Gz, there is the second excursion in k-space from $k=0$ to $k=K_B$ during the time intervals $t_{B1}$ through $t_{B7}$. In the first sub-cycle, the excursion in k-space passes sequentially through the transform lobes F centered at $k=0$ and at $k=K_A$ while in the second sub-cycle, the excursion k space passes sequentially through the transform lobes F centered at $k=0$, $k=K_A+K_B$ and $k=K_B$.

In the first sub-cycle, during the time interval $t_{A1}$, slice selection gradient Gz has a negative rephasing pulse, read gradient Gx has a negative preparation pulse and phase encoding gradient Gy has a positive or negative pulse of a different amplitude each sequence. The pulses in Gx and Gy during $t_{A1}$ cause the excursion in k-space from $k=0$ to point 70 which point is the starting point for a scan through the main transform lobe F centered at $k=0$. During $t_{A2}$ a positive pulse is applied to read gradient Gx to achieve this scan by an excursion in k-space to point 72 during which time the RF field echo $S_A(O)$ is detected in receiver 6 and samples thereof collected in memory 14. in the same manner as in a conventional spin-warp sequence. However, in contradistinction to such a conventional sequence, during $t_{A3}$ a negative pulse is applied to Gx and a positive pulse is applied to Gy so that the integrals of these pulses cause the excursion in k-space from point 72 to point 74. Point 74 is located at the same position relative to $k=K_A$ as point 70 is located relative to $k=0$. Then, during $t_{A3}$, to achieve the scanning excursion to point 76, the read gradient Gx is again applied and the field echo $S_A(K_A)$ is detected and samples thereof collected in memory 14. Thereafter, during $t_{A5}$, Gz has a dephasing negative pulse while a negative pulse in Gx (the same as during $t_{A1}$) and the phase de-encoding pulse in Gy (opposite to that applied during $t_{A1}$) produce the excursion from point 76 to $k=K_A$ in preparation for the next sub-cycle.

In the second sub-cycle, the various gradient signals during $t_{b1}$ and $t_{B2}$ are respectively identical to those during $t_{A1}$ and $t_{A2}$ producing the same scan through the main transform lobe centered at $k=0$ and the collection of the field echo signal $S_B(O)$. However, during $t_{B3}$, pulses are applied to Gx and Gy to make the excursion in k-space from point 72 to point 78, point 78 being at the same position relative to $k=K_A+K_B$ as point 70 is relative to $k=0$. Then, during $t_{B4}$, the read gradient Gx is again applied and the scanning excursion to point 80 is made during which time samples of the echo signal $S_B(K_A+K_B)$ are collected. Thereafter, during $t_{B5}$, pulses are applied to Gx and Gy to cause the excursion in k-space from point 80 to point 82. The latter point is also located at the same position relative to $k=K_B$ as point 70 is located relative to $k=0$. In time interval $t_{B6}$, through the application again of read gradient Gx, the excursion in k-space is made to point 84 during which time samples of the echo signal $S_B(K_B)$ are collected. Lastly, gradient pulses during $t_{B7}$ are applied identical to those applied during $t_{A5}$ to make the excursion in k-space to $K_B$ in preparation for the next cycle.

It should be appreciated that the phase encoding gradient pulses during $t_{A1}$ and $t_{B1}$ and the opposite phase de-encoding gradient pulses during $t_{A5}$ and $t_{B7}$ are varied from cycle to cycle to achieve a collection of parallel scans through the transform lobes F centered at $k=0$, $k_A$, $K_A+K_B$, and $K_B$. In slice selection gradient Gz, the various negative pulses are selected to balance the various positive pulses so that Gz integrates to zero over each sub-cycle. For each cycle, Gx and Gy respectively integrate to the $k_x$ and the $k_y$ components of the vector $K_A$ in the first sub-cycle and to the $k_x$ and $k_y$ components of the vector $K_B$ in the second sub-cycle.

Multiple mode steady state free precession may be generalized to a fundamental cycle having N different sub-cycles, each having a constant gradient integral over the sub-cycle in each successive cycle of the sequence. Numerous variations are possible in the details of the sequence. For example, sequences may be fashioned for use in spectroscopic imaging applications, for instance, wherein the RF excitation pulses are configured for water-suppressed proton lactate imaging. The sequences may be for two dimensional slice selection, as has been illustrated, or alternatively, volume acquisition may be utilized with two phase-encoding gradients and one read gradient.

The invention may be utilized in multiple-slice imaging and with different methods of image reconstruction such as DISCRETE FOURIER TRANSFORM or PROJECTION RECONSTRUCTION. Another possible variant is the use of the rapidly varying gradients of the echo-planar imaging technique within each sub-sequence, allowing within each sub-sequence the collection of a group of parallel scans of one or more of the image transform lobes.

The RF pulse angles, sub-cycle durations and gradient integrals may be chosen either theoretically or empirically to produce a set of images with a range of $T_2$ or $T_1$ sensitivities. Furthermore, by using a gradient waveform sensitive to flow or diffusion, plural flow or diffusion-sensitive images may be obtained, perhaps with sensitivities in different directions.

Figure 5:
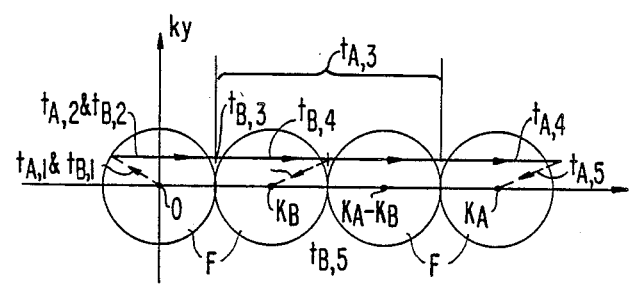
FIG. 5 is a diagram of k-space excursion due to a second illustrative sequence in accordance with the principles of the present invention.
Figure 6:
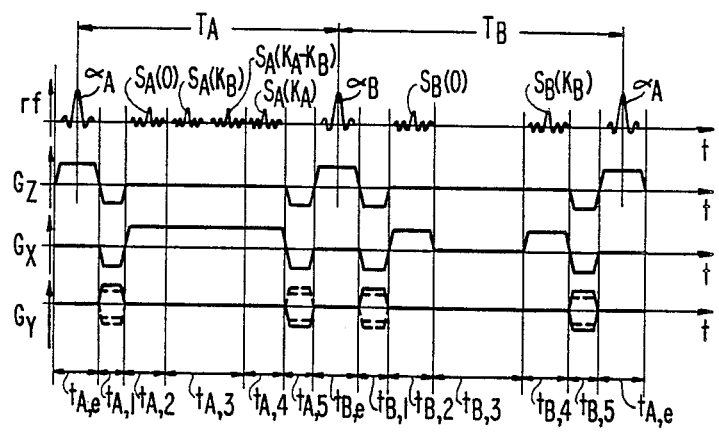
FIG. 6 is a time diagram of RF and gradient signals for the second illustrative sequence in accordance with the principles of the present invention producing the k-space excursions in FIG. 5.

FIGS. 5 and 6 are corresponding k-space excursions and time diagrams of rf and gradient signals whereby rf signals, $S_A(K_A)$ and $S_B(K_B)$, may be collected from a pair of image transform lobes to yield diffusion sensitivity. Therein $K_B$ and $K_A$ both lie on the $k_x$ axis with $K_A > K_B$; $\alpha_A$, $T_A$ and $\alpha_B$, $T_B$ are respectively equal. Furthermore, $T_A$ is composed of intervals $t_{Ae}$ and $t_{A1}$ through $t_{A5}$ which intervals are equal in time duration respectively to intervals $t_{Ae}$ and $T_{B1}$ through $t_{B5}$. A steady state free precession spin ensemble is then characterized by pertinent transform lobes F centered at $k=0$, $K_B$, $K_A-K_B$ and $K_A$. The sub-cycles differ only in the Gx signal during the respective intervals $T_{A3}$ and $T_{B3}$, Gx being held constant over $T_{A1}-t_{A4}$ in sub-cycle "A" (causing scan through the lobes F centered at $K_B$ and $K_A-K_B$) and being zero over $t_{B3}$ in sub-cycle "B". As a result during $t_{A4}$ the transform lobe F centered about $K_A$ is scanned producing the echo signal $S_A(K_A)$ while during $t_{A5}$ the transform lobe F centered about $K_B$ is scanned producing the echo signal $S_B(K_B)$. Because $S_A(K_A)$ and $S_B(K_B)$ have the same echo time $T_E$ and differ only in gradient history, images formed therefrom differ only by respective attenuation factors of the form $\exp(-b_A D)$ and $\exp(-b_B D)$ where D is the diffusion constant and $b_A$ and $b_B$ are sub cycle dependent diffusion sensitivities which may be determined theoretically or empirically. The difference between the natural logarithms on a pixel by pixel basis of the images formed from the separate collections of $S_A(K_A)$ and $S_B(K_B)$ are then proportionate to the diffusion constant at each pixel.

It should be apparent therefore that the object of the invention has been accomplished and further that numerous modifications, additions and omissions in the details of the preferred embodiments specifically described herein are possible within the intended spirit and scope of the invention.

What is claimed is:

1. A steady state free precession magnetic resonance imaging method comprising:
   subjecting an examination zone, in the presence of a substantially uniform steady magnetic field. to a sequence of a plurality of cycles of RF magnetic field excitation pulses and variations of gradient magnetic fields in mutually orthogonal directions;
   detecting magnetic resonance echo signals excited by said cycles; and
   processing said detected signals into image indications;
   wherein said cycles are chosen to produce magnetic resonance signals characterized by a steady state free precession function in k-space from which echo signals are excited by said sequences, said function comprising a plurality of image transform lobes spaced-apart in k-space; and
   wherein said cycles are further chosen to excite separate echo signals due to different ones of said image transform lobes, each cycle exciting at least two separate echo signals from different ones of said image transform lobes and each cycle comprising first and second sub-cycles having respective rf excitation pulse angles, durations and gradient integrals in each cycle, said first and second sub-cycles differing in at least one of gradient integral, rf excitation pulse angle, and duration.

2. The method of claim 1 wherein each cycle excites at least three different echo signals respectively from different ones of said image transform lobes.

3. The method of claim 1 wherein each cycle excites at least four separate echo signals respectively from different ones of said image transform lobes.

4. The method of claim 1 wherein said two separate echo signals are excited in the same sub-cycle.

5. The method of claim 1 wherein said two separate echo signals are excited in different sub-cycles.

6. The method of claim 2 wherein said three separate echo signals are excited in the same sub-cycle.

7. The method of claim 1 further comprising collecting said detected magnetic resonance echo signals into at least two distinct collections, respectively corresponding to the at least two different ones of said image transform lobes.

8. The method of claim 1 wherein said different ones of said image transform lobes correspond to differently weighted images.

9. The method of claim 2 wherein said at least three different ones of said image transform lobes correspond to differently weighted images.

10. The method of claim 8 wherein said differently weighted images differ only in regard to one physical parameter selected from flow, diffusion and relaxation.

11. A multi-mode magnetic resonance scanning method in the presence of a substantially uniform steady magnetic field in an examination area comprising:
  first exciting relaxing magnetic resonance spins in a portion of an examination zone with a first RF pulse;
  first applying varying gradient magnetic fields to the excited magnetic resonance spins in a manner that the integral over time of said gradient magnetic fields follows a first path and k-space from $k=0$ to $k=K_A$, said first path including a first scan proximate $k=0$ and a second scan proximate to $k=K_A$, $K_A$ being different from $K_B$;
  second exciting relaxing magnetic resonance spins in said portion of the examination area, before said first excited magnetic resonance spins have decayed to insignificance;
  second applying varying gradient magnetic fields to the excited magnetic resonance spins in a manner that the integral over time of said gradient magnetic fields follows a second path in k space from $k=0$ to $k=K_B$, said second path including a third scan proximate $k=0$ and a fourth scan proximate $k=K_B$; and
  repeating all steps herein, in the order stated, a plurality of times, the repeated first exciting being before the last preceding second excited magnetic resonance spins have relaxed to insignificance.

12. The method of claim 11 wherein at least one of said first and second paths includes a scan during which k has a magnitude proximate a magnitude of $K_A \pm K_B$.

13. The method of claim 11 wherein $K_A$ and $K_B$ are chosen such that the magnitude each of $K_A$, $K_B$ and $K_A \pm K_B$ is greater than the greatest spatial frequency expected to be present in the portion of the examination area first and second excited.

14. The method of claim 13 wherein at least one of said first and second paths includes a scan during which k has a magnitude proximate a magnitude of $K_A \pm K_B$.

15. The method of claim 10 wherein $K_A$ and $K_B$ are symmetrically disposed with respect to an axis in k-space.

16. The method of claim 10 wherein $K_A$ and $K_B$ are disposed on an axis in k-space.

17. Magnetic resonance imaging apparatus comprising:
  main magnet means for applying a substantially uniform steady magnetic field to an examination area;
  RF transmission coil means for applying an RF magnetic pulse to said examination area;
  gradient coil means for applying gradient magnetic fields to said examination area directed parallel to the uniform steady magnetic field with gradients in mutually orthogonal directions;
  control means for controlling said RF coil means and said gradient coil means in sequences;
  RF detection coil means for detecting magnetic resonance echo signals excited by said sequences; and
  processing means for processing said detected signals into image indications;
  wherein said sequences are chosen to produce magnetic resonance signals characterized by a steady state free precession function in k-space from which echo signals are excited by said sequences said function comprising a plurality of image transform lobes spaced-apart in k-space; and
  wherein said sequences are further chosen to excite during the sequences separate echo signals due to different ones of said image transform lobes each sequence exciting at least two separate echo signals from different ones of said image transform lobes.

* * * * *